US011180932B2

(12) United States Patent
King et al.

(10) Patent No.: US 11,180,932 B2
(45) Date of Patent: Nov. 23, 2021

(54) THEFT DETERRENT SYSTEM FOR ELECTRONICS CABINET DOOR

(71) Applicant: CommScope Technologies LLC, Hickory, NC (US)

(72) Inventors: Alfred W. King, Allen, TX (US); Carmen M. Stevenson, Cumby, TX (US); Komen Shliker, Plano, TX (US); Stephen P. Watson, Richardson, TX (US); Wade J. Womack, Allen, TX (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 16/715,295

(22) Filed: Dec. 16, 2019

(65) Prior Publication Data

US 2020/0115929 A1 Apr. 16, 2020

Related U.S. Application Data

(62) Division of application No. 16/404,936, filed on May 7, 2019, now Pat. No. 10,533,348.
(Continued)

(51) Int. Cl.
*E05B 67/38* (2006.01)
*E05B 67/06* (2006.01)
(Continued)

(52) U.S. Cl.
CPC ............ *E05B 67/383* (2013.01); *E05B 65/48* (2013.01); *E05B 67/06* (2013.01); *E05B 67/38* (2013.01);
(Continued)

(58) Field of Classification Search
CPC . E05B 1/04; E05B 63/24; E05B 65/44; E05B 65/48; E05B 67/00; E05B 67/02;
(Continued)

(56) References Cited

U.S. PATENT DOCUMENTS 3,652,114 A 3/1972 Cady et al.
3,858,923 A 1/1975 Bunn
(Continued)

FOREIGN PATENT DOCUMENTS

WO WO-2012054839 A1 * 4/2012 ........... E05B 67/383

*Primary Examiner* — Christopher J Boswell
(74) *Attorney, Agent, or Firm* — Myers Bigel, P.A.

(57) ABSTRACT

A theft deterrent system for an electronics cabinet may include a first hasp, which may include a plurality of studs extending from a surface thereof. At least one stud of the plurality of studs may be dimensioned to engage with a padlock ring of the electronics cabinet. The first hasp may have a tab having a shackle hole therein. The theft deterrent system may include a second hasp, which may include a plurality of holes dimensioned to receive a respective one of the plurality of studs. The second hasp may also have a tab having a shackle hole therein. The system may further include a shield retainer dimensioned to surround at least portions of the first hasp and the second hasp. To secure the electronics cabinet, a shackle of a hidden shackle lock may be fed through the shackle holes and the hidden shackle lock may then be locked.

8 Claims, 16 Drawing Sheets

Related U.S. Application Data

(60) Provisional application No. 62/670,037, filed on May 11, 2018.

(51) Int. Cl.
   *H05K 5/02* (2006.01)
   *E05B 65/48* (2006.01)

(52) U.S. Cl.
   CPC ...... *H05K 5/0221* (2013.01); *E05Y 2900/208* (2013.01)

(58) Field of Classification Search
   CPC .......... E05B 67/04; E05B 67/06; E05B 67/36; E05B 67/38; E05B 67/383; E05B 13/001; H05K 5/02; H05K 5/0221
   See application file for complete search history.

(56) References Cited

U.S. PATENT DOCUMENTS

| | | | |
|---|---|---|---|
| 4,548,058 A | 10/1985 | Bahry et al. | |
| 4,761,975 A * | 8/1988 | Kachnowski | E05B 67/383 70/232 |
| 4,938,041 A | 7/1990 | Ogara | |
| 5,406,814 A | 4/1995 | Zeager et al. | |
| 5,787,739 A | 8/1998 | Derman | |
| 5,819,561 A | 10/1998 | Blehi | |
| 5,924,314 A * | 7/1999 | Cernansky | E05B 67/38 70/56 |
| 5,946,952 A * | 9/1999 | Mintchenko | E05B 67/36 292/148 |
| 7,249,476 B2 * | 7/2007 | Wilson | E05B 67/383 70/101 |
| 7,278,284 B1 * | 10/2007 | James | E05B 67/38 70/56 |
| 7,290,415 B2 | 11/2007 | Rosenberg et al. | |
| 8,220,296 B2 * | 7/2012 | Boonstra | E05B 67/383 70/2 |
| 8,347,661 B2 | 1/2013 | Kaminsky | |
| 8,496,276 B2 * | 7/2013 | Kaminsky, Jr. | E05B 65/06 292/216 |
| 8,601,842 B2 * | 12/2013 | Sheldahl | E05B 67/383 70/417 |
| 8,689,590 B2 * | 4/2014 | Madruga | E05B 67/383 70/56 |
| 8,820,125 B1 | 9/2014 | Dolev | |
| 9,032,765 B2 * | 5/2015 | Boesel | E05B 67/383 70/56 |
| 10,184,275 B2 * | 1/2019 | Harris | E05B 15/16 |
| 10,518,746 B1 * | 12/2019 | Grimmett | E05B 67/383 |
| 10,533,348 B2 * | 1/2020 | King | E05B 65/48 |
| 2010/0180646 A1 * | 7/2010 | Mazingo | E05B 67/383 70/20 |
| 2014/0260445 A1 * | 9/2014 | Vellani | E05B 67/383 70/101 |
| 2017/0037662 A1 * | 2/2017 | Braun | E05B 67/383 |
| 2019/0383070 A1 * | 12/2019 | Marchl | E05B 67/383 |

* cited by examiner

THEFT DETERRENT SYSTEM FOR ELECTRONICS CABINET DOOR

CROSS-REFERENCE TO RELATED APPLICATIONS

The present application is a divisional of and claims priority to U.S. patent application Ser. No. 16/404,936, filed on May 7, 2019, now allowed, which claims priority under 35 U.S.C. § 119 to U.S. Provisional Application No. 62/670,037, filed on May 11, 2018, and entitled "THEFT DETERRENT SYSTEM FOR ELECTRONICS CABINET DOOR," the entire contents of which are hereby incorporated by reference as if set forth herein.

TECHNICAL FIELD

The present disclosure relates generally to cabinets, and more specifically to electronics cabinets.

BACKGROUND

Outdoor electronic cabinets have become popular in recent years. They can protect a wide range of electronic equipment including radios, multicarrier power amplifiers (MCPA), power supplies, batteries, and wireless cell site backhaul equipment. These cabinets can protect base station equipment from environmental conditions while minimizing operating expenses and energy consumption.

Typically, electronics cabinets include one or two doors mounted to the front of the cabinet to provide access to components positioned within the front portion of the cabinet.

Unfortunately, electronics cabinets are often targets for theft and vandalism, with batteries being a particularly attractive commodity. As such, locking systems that prevent unwanted access to an interior of an electronics cabinet are desirable.

SUMMARY

Aspects of the present disclosure provide methods and systems for securing cabinets such as electronics cabinets. For example, some aspects of the present disclosure provide a theft deterrent system, which may include a first hasp having a plurality of studs extending from a surface of the first hasp. At least one stud of the plurality of studs may be dimensioned to engage with a padlock ring of an electronics cabinet, and the first hasp may include a tab having a shackle hole therein. The theft deterrent system may also include a second hasp including a plurality of holes in a surface of the second hasp, where each hole of the plurality of holes is dimensioned to receive a respective one of the plurality of studs. The second hasp may include a tab having a shackle hole therein. The theft deterrent system may also include a shield retainer dimensioned to surround at least a portion of the first hasp and a portion of the second hasp.

Some aspects of the present disclosure provide a method that includes: feeding a stud extending from a first hasp into a through-hole in a padlock ring of a handle of an electronics cabinet, where the first hasp is adapted to at least partially cover the handle; feeding the stud extending from the first hasp with a receiving hole in a second hasp, where the second hasp is adapted to at least partially cover the handle, aligning a shield retainer to surround at least a portion of the first hasp and at least a portion of the second hasp; inserting a shackle of a lock through through-holes in the first hasp and the second hasp; and locking the lock.

Some aspects of the present disclosure provide a theft deterrent system. The system may include a first hasp having a plurality of studs extending from a surface of the first hasp, with at least one stud of the plurality of studs dimensioned to engage with a padlock ring of an electronics cabinet. The first hasp may include a tab having a shackle hole therein. The theft deterrent system may also include a second hasp having a plurality of holes in a surface of the second hasp, where each hole of the plurality of holes may be dimensioned to receive a respective one of the plurality of studs, and where the second hasp may include a tab having a shackle hole therein. The theft deterrent system may also include a shield retainer dimensioned to surround the first hasp and the second hasp. The shield retainer may include an adapter that includes a tab having a shackle hole therein, and the shield retainer may include an opening dimensioned to receive an outer circumference of a hidden shackle lock.

Some aspects of the present disclosure provide a system that includes an electronics cabinet. The system also includes a first hasp with a plurality of studs extending from a surface of the first hasp, where at least one stud of the plurality of studs is dimensioned to engage with a padlock ring of the electronics cabinet, and where the first hasp includes a tab having a shackle hole therein. The system also includes a second hasp including a plurality of holes in a surface of the second hasp, where each hole of the plurality of holes is dimensioned to receive a respective one of the plurality of studs and where the second hasp includes a tab having a shackle hole therein. The system also includes a shield retainer dimensioned to surround at least a portion of the first hasp and a portion of the second hasp.

DETAILED DESCRIPTION

Figure 1:
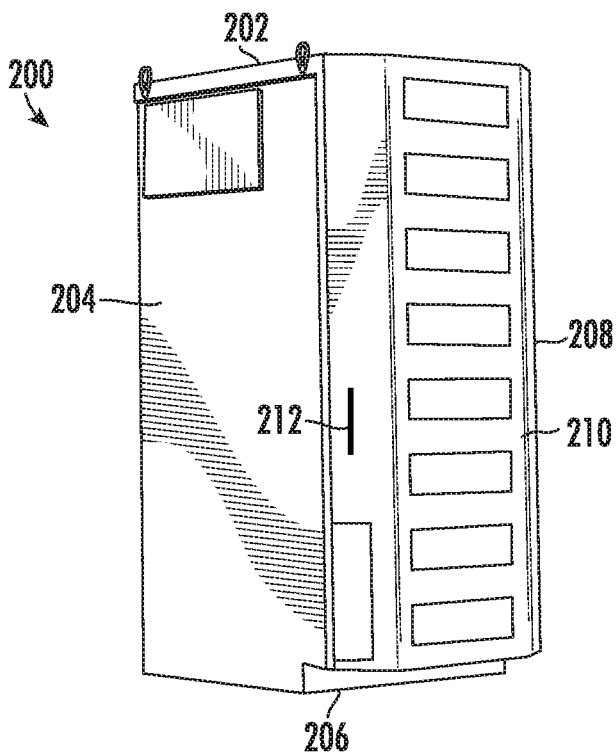
FIG. 1 is a perspective view of a conventional electronics cabinet.

The inventive concepts provided in the present disclosure are described more fully hereinafter with reference to the accompanying drawings, in which embodiments of the inventive concepts are shown. These inventive concepts may, however, be embodied in many different forms and should not be construed as limited to the embodiments set forth herein; rather, these embodiments are provided so that this disclosure will be thorough and complete, and will fully convey the scope of the inventive concepts to those skilled in the art.

Like numbers refer to like elements throughout. In the figures, the thickness of certain lines, layers, components, elements or features may be exaggerated for clarity.

The terminology used herein is for the purpose of describing particular embodiments only and is not intended to be limiting of the inventive concepts. Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under," "below," "lower," "over," "upper," "lateral," "left," "right," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented over" the other elements or features. The device may be otherwise oriented (rotated 90 degrees or at other orientations) and the descriptors of relative spatial relationships used herein interpreted accordingly.

Referring now to the drawings, a conventional electronics cabinet, designated broadly at 200, is shown in FIG. 1. The cabinet 200 may be generally box-shaped, with a ceiling 202, side walls 204, a floor 206 and a front wall 208 that may be, or may include, a door 210. The door 210 may be hinged to swing out from the interior cavity (not shown) of the cabinet 200, or may be a removable panel. The door 210 may be manipulated via a handle 212. Manipulation of the handle 212 (e.g., by rotating, pulling, pushing, or the like) results in a corresponding movement of one or more latches (not shown) that engage with a wall or other portion of the cabinet 200, allowing for the door 210 to swing about its hinges or to be removed, as the case may be.

In some cabinets, the handle 212 may be arranged in a pocket formed in the door 210. The pocket may protect the handle from environmental conditions that may degrade the handle or latches (e.g., oxidation). A pocket 214 of a cabinet 200 may be best seen in FIGS. 7C, 7D, 7E, 12A, and 12B.

The handle 212 may include one or more features (not shown) designed to restrict unwanted access to the cabinet 200. One common example is the inclusion of a keyway (or keyhole) on or near the handle. Another example of such a feature includes one or more through-holes in a padlock ring 216 in the handle 212. The one or more through-holes may be dimensioned to receive a shackle of a lock. A padlock ring 216 of a handle 212 may be best seen in FIG. 7A.

Figure 2A:
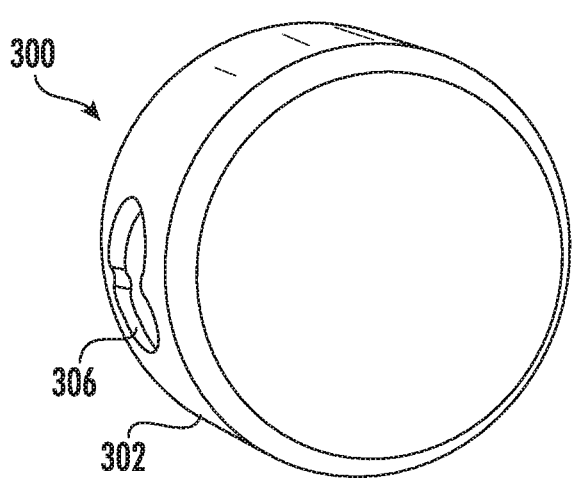
FIG. 2A is a front view of a conventional hidden shackle lock or "hockey puck" lock usable to secure the electronics cabinet of FIG. 1.
Figure 2B:
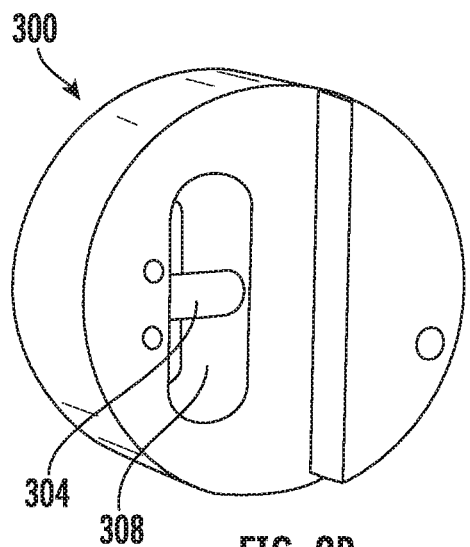
FIG. 2B is a rear view of the conventional hidden shackle lock of FIG. 2A.

Although padlocks having exposed shackles are known and usable to secure a handle 212 of a door 210, it has been realized that locks having exposed shackles have disadvantages, in that the shackle may be compromised through cutting, prying, melting, drilling or the like. An alternative is a hidden shackle lock. With reference to FIGS. 2A and 2B, a hidden shackle lock is often referred to as a "hockey puck" lock, given that the lock may have a similar size and shape to a hockey puck. A hidden shackle lock 300 may include a body 302 in which a locking mechanism (not shown) is disposed, and a shackle 304. The shackle 304 may extend within the body 302 and, when the lock is secured, does not extend beyond the outer circumference of the body 302, and the shackle 304 extends through a through-hole of a securable component that has been inserted into an opening 308. When the lock 300 is unsecured or unlocked, the shackle 304 may slide and travel to extend beyond the outer circumference of the hidden shackle lock 300, providing access to the opening 308 and to the securable component.

The locking mechanism of the hidden shackle lock 300 may be locked and unlocked, and, correspondingly, the shackle 304 thereof may be engaged or disengaged, via one or more actions. For example, a key may be inserted into a keyway 306 located on a side of the lock body 302. As another example, a codephrase (e.g., alphanumeric or numeric combination) may be entered using one or more rotating dials. More recently, a signal may be transmitted to a receiver within the lock body from a remote device (e.g., via a signal transmitted using BLUETOOTH, WI-FI, or other communication protocol). The inventive concepts provided in the present disclosure may be used with padlocks or locks having any type of locking mechanism, and those explicitly recited herein are provided for context, and not as limitations on the scope of the present disclosure.

Conventionally, installation of a hidden shackle lock (e.g., the hidden shackle lock 300) onto a cabinet (e.g., cabinet 200) is as follows. The lock may be unlocked, and the shackle 304 may be disengaged from a locking mechanism within the lock body 302. As a result, the shackle 304 may be slid out to partially extend from the lock body 302. The rear opening 308 of the hidden shackle lock 300 may be positioned over the padlock ring 216 of the handle 212 (or other securing feature of the cabinet 200), such that the travel path of the shackle 304 as it slides into engagement with the locking mechanism will result in the shackle 304 being fed into the receiving through-hole of the padlock ring 216 of the handle 212 of the cabinet door. The shackle 304 may then be re-engaged with the padlock body 302 and the locking mechanism therein.

Although deployment of a hidden shackle lock 300 prevents some instances of unwanted entry into the cabinet, locks and cabinets are susceptible to forced entry attack. Such forced entry attacks may be through using tools such as bolt cutters, chisels, hammers, drills, torches, pry bars or the like, and may permanently damage or destroy the lock. For example, a pipe wrench may be used to exert significant rotational force on the circumferential perimeter of the lock body 302, which may result in a corresponding rotational force being applied to the padlock ring 216 and/or the handle 212. These components may not be able to withstand the force, and may shear or otherwise fail, resulting in unwanted access to the interior of the cabinet, even where the shackle remains intact. In some situations, the handle 212 may be pried off of the cabinet 200, even when padlocked, and access to the latching mechanism coupled to the handle may be achieved, thus allowing opening of the door or door panel.

To address such attacks, the present disclosure provides systems and apparatuses that reduce access to a handle of an electronics cabinet and/or to a padlock attached to a handle of an electronics cabinet.

Figure 3A:
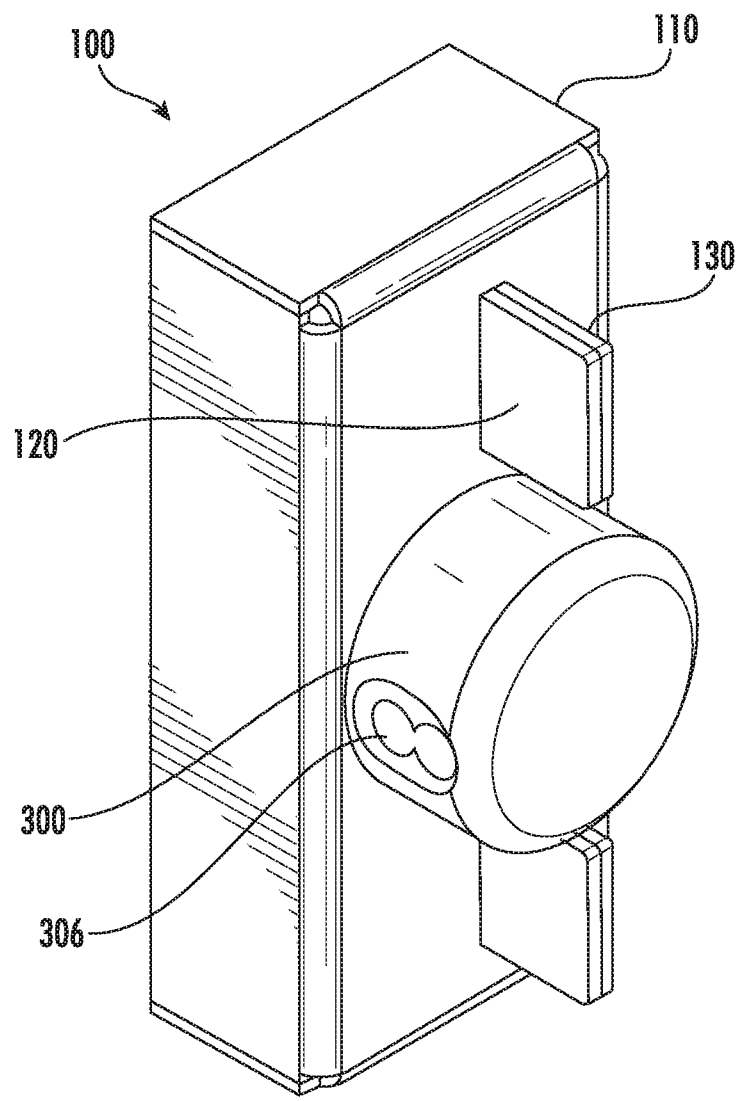
FIG. 3A is a perspective view of a theft deterrent system that is in accordance with the inventive concepts of the present disclosure.
Figure 3B:
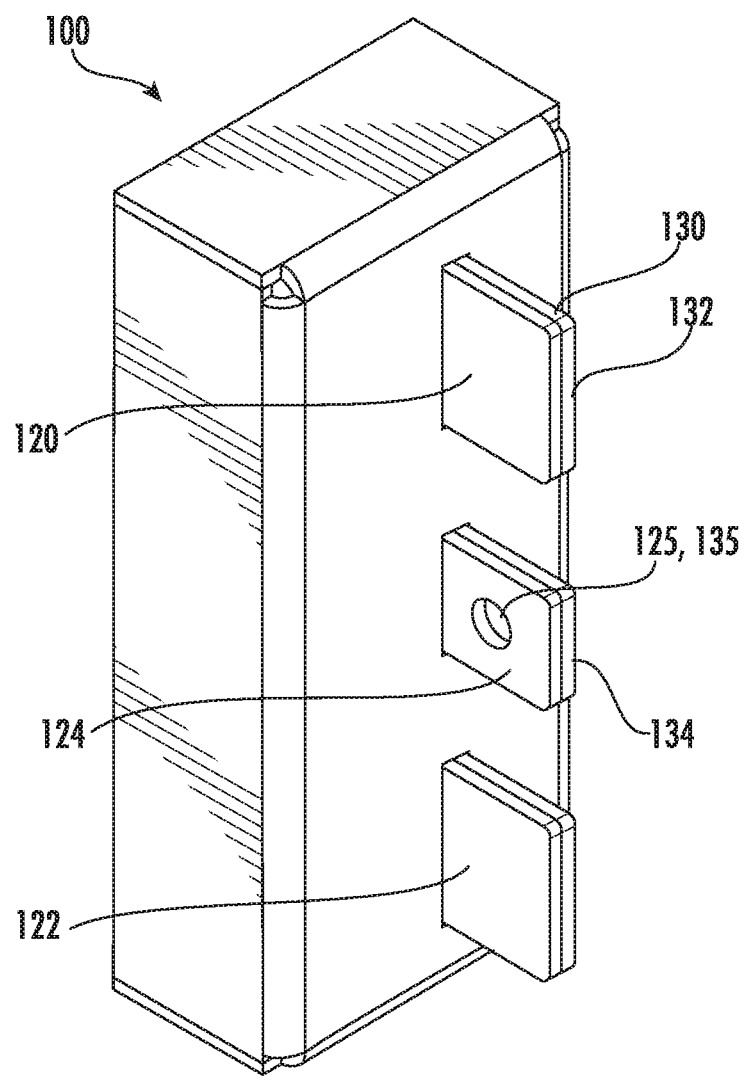
FIG. 3B is a perspective view of the theft deterrent system of FIG. 3A, with the hidden shackle lock removed.

As shown in FIG. 3A, a theft deterrent system 100 may include, in addition to a hidden shackle lock 300, a shield retainer 110, a first hasp 120, and a second hasp 130.

Figure 4A:
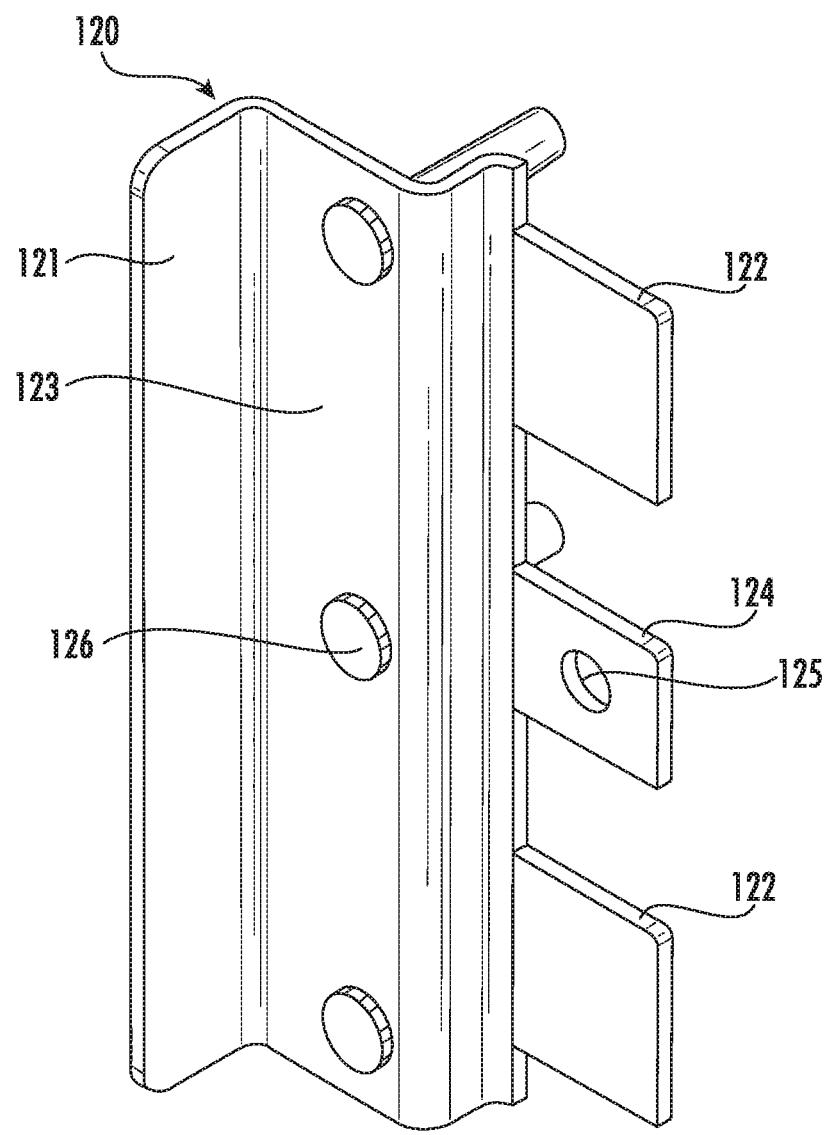
FIG. 4A is a side perspective view of a first hasp of the theft deterrent system of FIG. 3A.
Figure 4B:
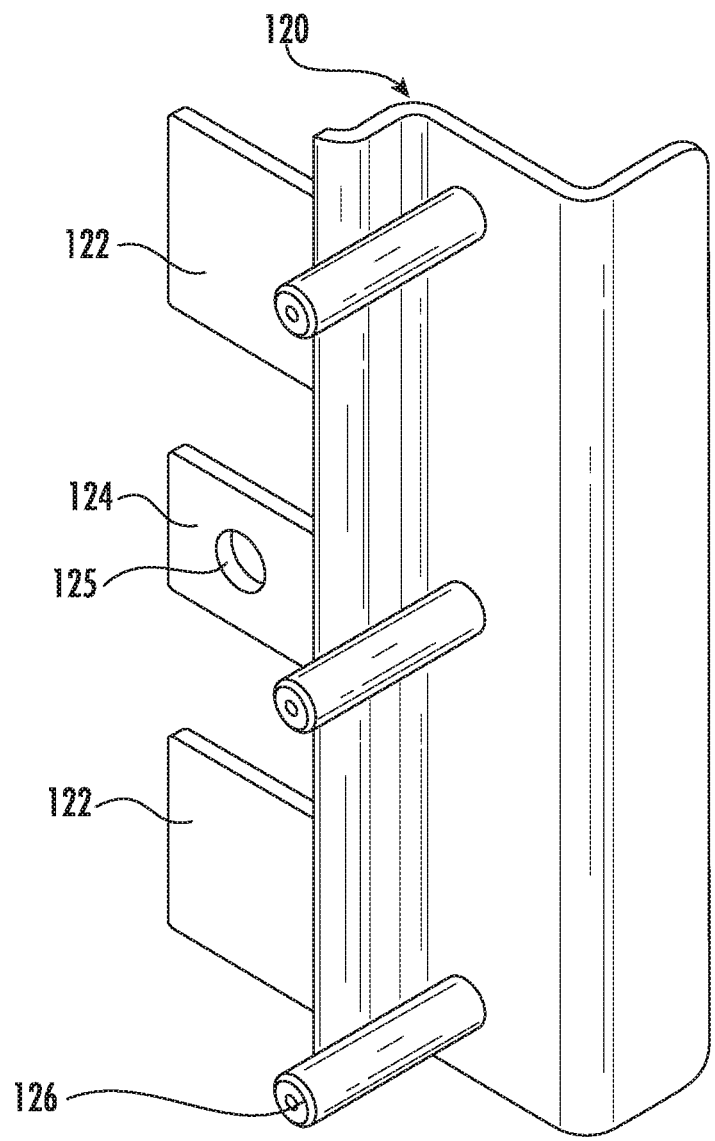
FIG. 4B is an opposite side perspective view of the first hasp of FIG. 4A.
Figure 5:
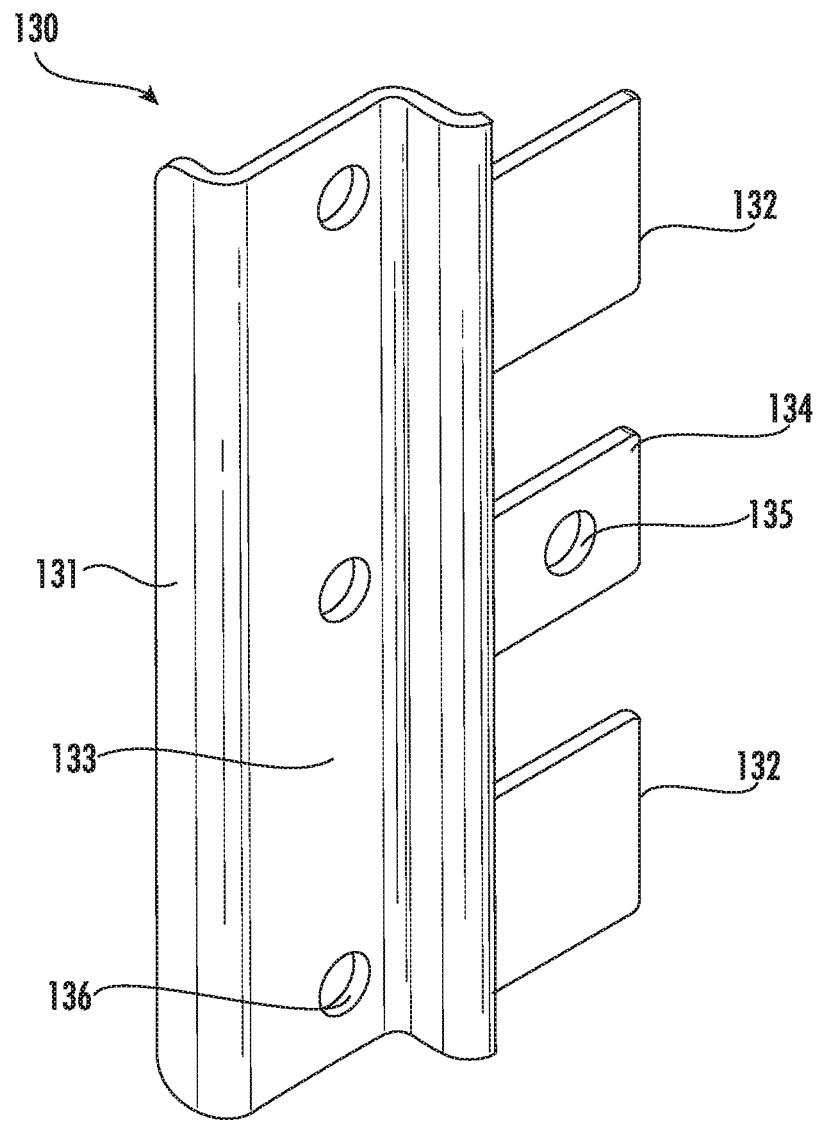
FIG. 5 is a perspective view of a second hasp of the theft deterrent system of FIG. 3A.

With reference to FIGS. 4A, 4B, and 5, the first hasp 120 and second hasp 130 may be each formed of metal, such as galvanized steel (e.g., approximately 0.090 inch galvanized steel) or other similar metal. In some embodiments, the first hasp 120 and second hasp 130 may be each formed as a separate unitary body (e.g., as a contiguous piece of metal) by machining, bending, and/or other manufacturing operations. The first hasp 120 may include a first panel 121 and a second panel 123 that is substantially perpendicular to the first panel 121. The first panel 121 may be configured to sit flush with and substantially parallel to an installation surface of a cabinet 200 onto which the theft deterrent system 100 is to be installed. For example, the installation surface of the cabinet 200 may be a door 210 of the cabinet 200 or panel of the cabinet 200. In a similar manner, the second hasp 130 may include a first panel 131 and a second panel 133 that is substantially perpendicular to the first panel 131. The first panel 131 may be configured to sit flush with and substantially parallel to a surface of a cabinet 200 onto which the theft deterrent system 100 is to be installed.

The first hasp 120 may include a plurality of tabs, which may include outer tabs 122 and a central tab 124, each of which may extend roughly parallel to the second panel 123 of the first hasp 120. The central tab 124 may be dimensioned to have a different surface area and/or cross-section than the outer tabs 122. The present disclosure is not limited to the number of and dimensions of the outer tabs 122 and the central tab 124 that are shown in FIGS. 5A and 5B. The central tab 124 may include a shackle through-hole 125.

In a similar manner, the second hasp 130 may include a plurality of tabs, which may include outer tabs 132 and a central tab 134, each of which may extend roughly parallel to the second panel 133 of the second hasp 130. The central tab 134 may be dimensioned to have a different surface area or cross-section than the outer tabs 132. The present disclosure is not limited to the number of and dimensions of the outer tabs 132 or the central tab 134 shown in FIG. 6. The central tab 134 of the second hasp 130 may include a shackle through-hole 135.

The outer tabs 122 and 132 of the respective hasps may be spaced apart such that a distance between them is slightly greater than a diameter of a hidden shackle lock 300, as shown in FIG. 3A.

The first hasp 120 may have a plurality of studs 126 installed therein. In some embodiments, holes (not shown) dimensioned to receive the plurality of studs 126 may be machined or otherwise formed into the second panel 123 of the first hasp 120. In some embodiments, the studs 126 may be self-clinching studs which are pressed into the dimensioned holes such that the studs 126 are retained by the holes in a permanent or near-permanent state. Other methods of assembling or manufacturing the first hasp 120 to include the plurality of studs 126 therein are within the scope of the present disclosure. Each of the plurality of studs 126, or at least a central stud 126 of the plurality of studs 126, may have a similar dimension (e.g., a radius) as that of a shackle 304 of a hidden shackle lock 300 (or other shackle lock).

The second hasp 130 may have a plurality of holes 136 in the second panel 133, each of which may be dimensioned to receive a corresponding one of the plurality of studs 126 of the first hasp 120.

Bends, curves, and/or other features may be provided in the bodies of first hasp 120 and second hasp 130 such that, when installed on a cabinet 200, the tabs 122/124 of the first hasp 120 may sit flush with, or may be otherwise proximate to, the tabs 132/134 of the second hasp 130. Conversely, the first panels 121 and 131 of the hasps, and the second panels 123 and 133 of the respective hasps 120 and 130, may not sit flush with each other, and may instead be spaced apart on either side of the handle 212 of the cabinet 200. As a result, upon installation of the first hasp 120 and the second hasp 130, the handle 212 may be considered to sit within a channel having the second panels of the hasps as sidewalls.

Figure 6A:
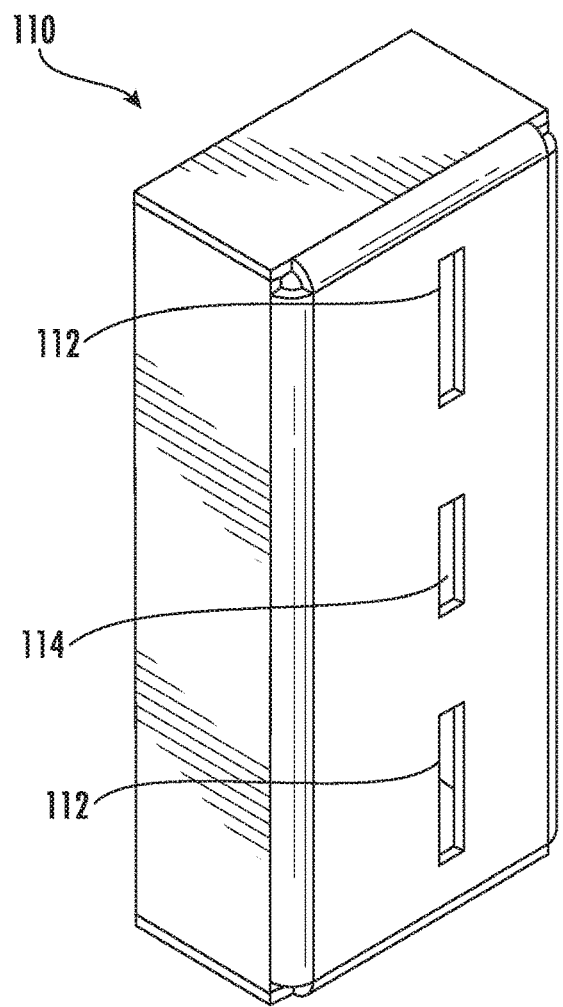
FIG. 6A is a front perspective view of a shield retainer of the theft deterrent system of FIG. 3A.
Figure 6B:
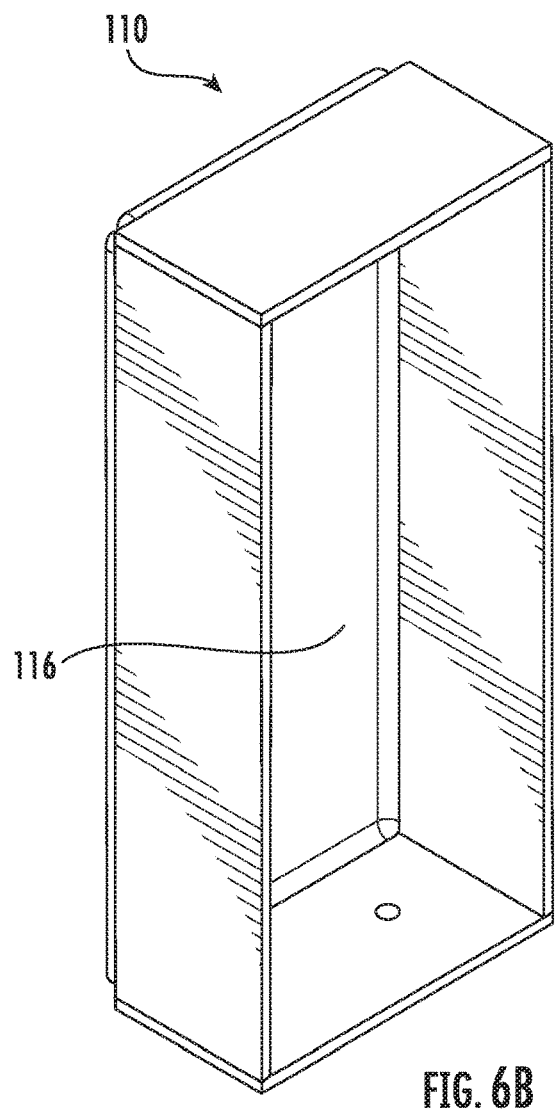
FIG. 6B is a rear perspective view of the shield retainer of FIG. 6A.

Also provided in the theft deterrent system 100 of FIG. 3A is a shield retainer 110, as shown in FIGS. 6A and 6B. The shield retainer 110 may be formed of one or more pieces of metal, for example, 0.090 inch galvanized steel, though other metals compatible with the context of the present application are within the scope of the present disclosure. A front panel of the shield retainer 110 may include one or more slots 112, 114 corresponding to the number and dimensions of the tabs of the first hasp 120 and the second hasp 130. For example, FIG. 6A shows the shield retainer 110 having two outer slots 112 dimensioned to receive the outer tabs 122/132 of the first hasp 120 and second hasp 130. FIG. 6A further shows the shield retainer 110 having a central slot 114 dimensioned to receive the central slot 124/134 of each of the first and second hasp. As shown in FIG. 6B, the shield retainer 110 may be open to the rear or back of the shield retainer, and an opening 116 therein may be dimensioned to receive the lengths (along their long axis) and widths (at the first panels thereof) of the hasps 120, 130 when the hasps 120, 130 are in their installed state. Accordingly, once installed, the shield retainer 110 may prevent access to the first and second panels of each hasp 120 and 130.

Figure 7A:
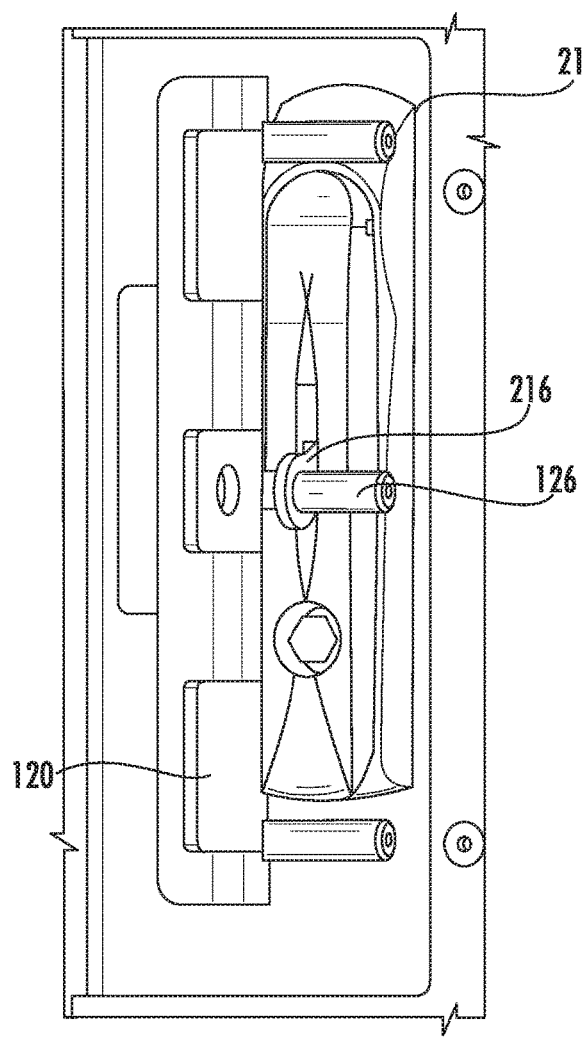
FIGS. 7A-7E are views of operations of installing the theft deterrent system of FIG. 3A on an electronics cabinet.
Figure 7B:
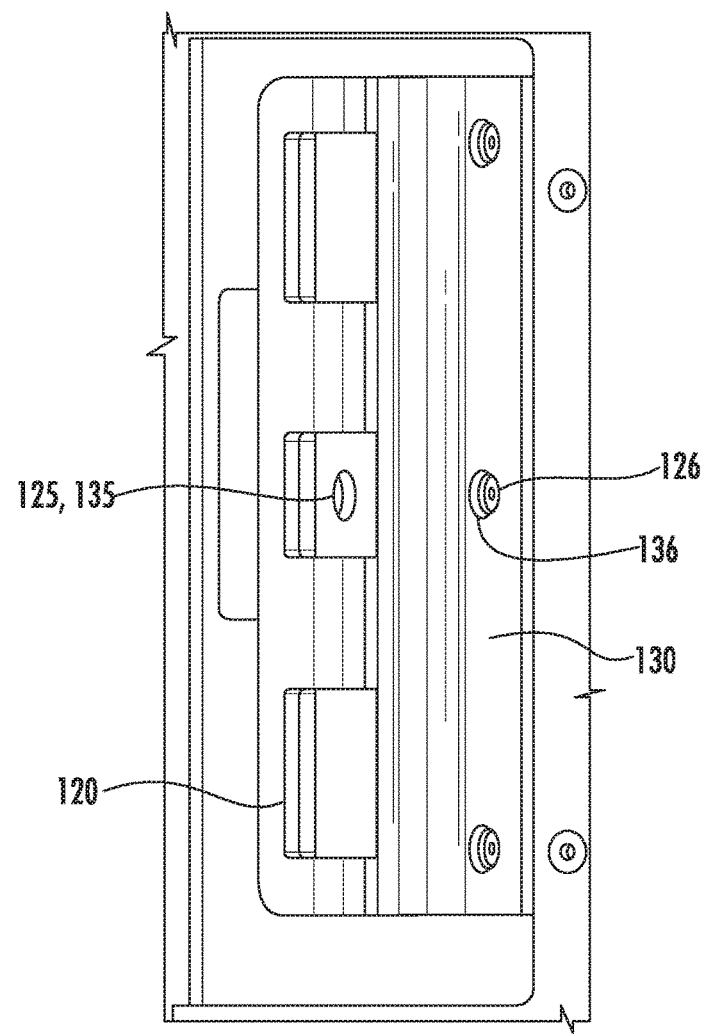
Figure 7C:
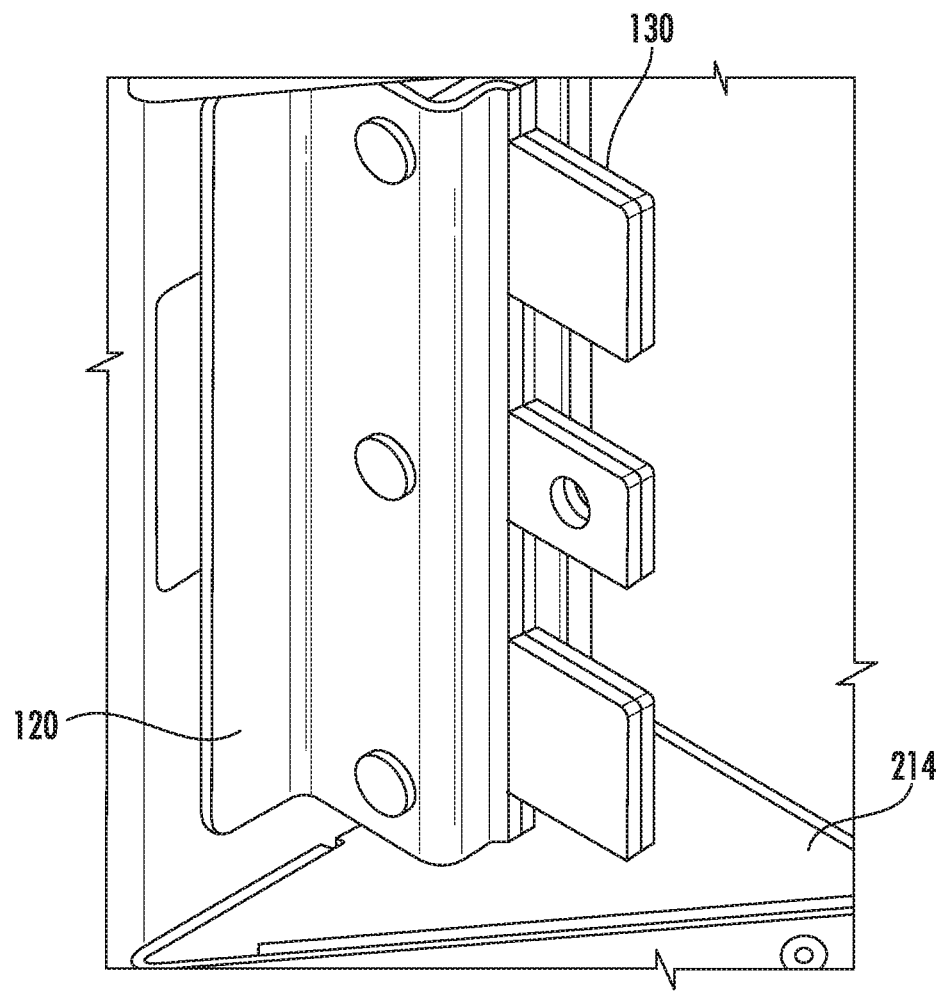
Figure 7D:
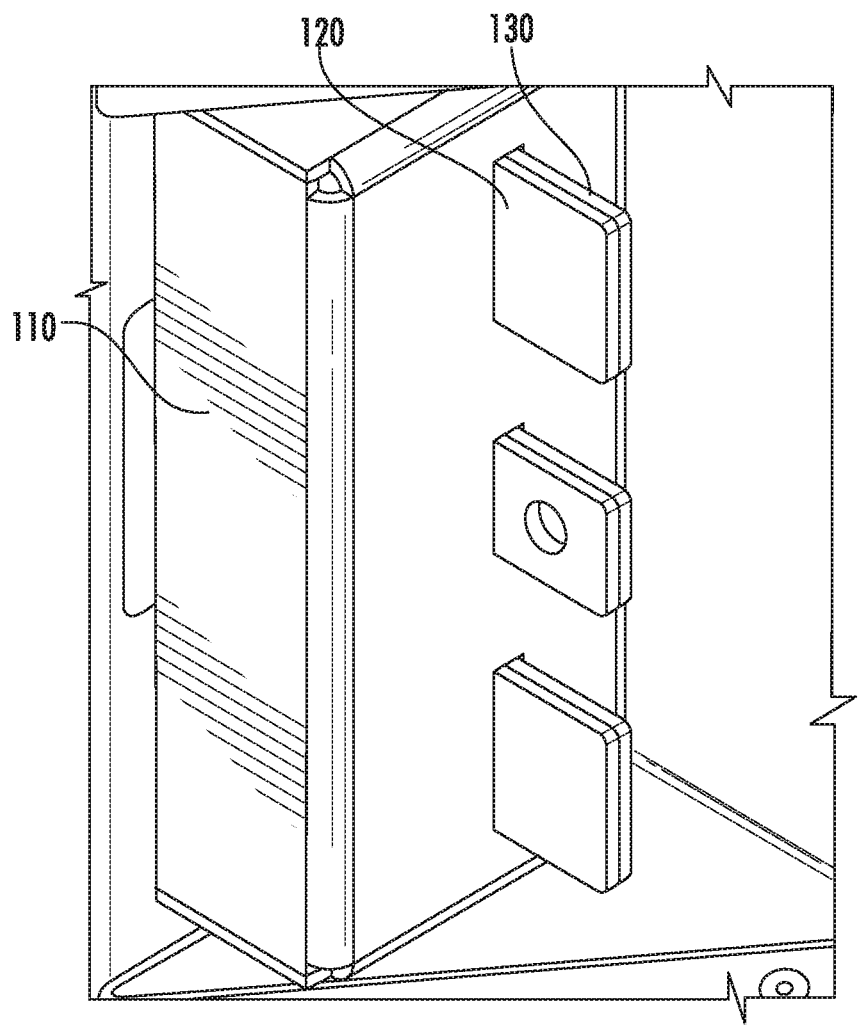
Figure 7E:
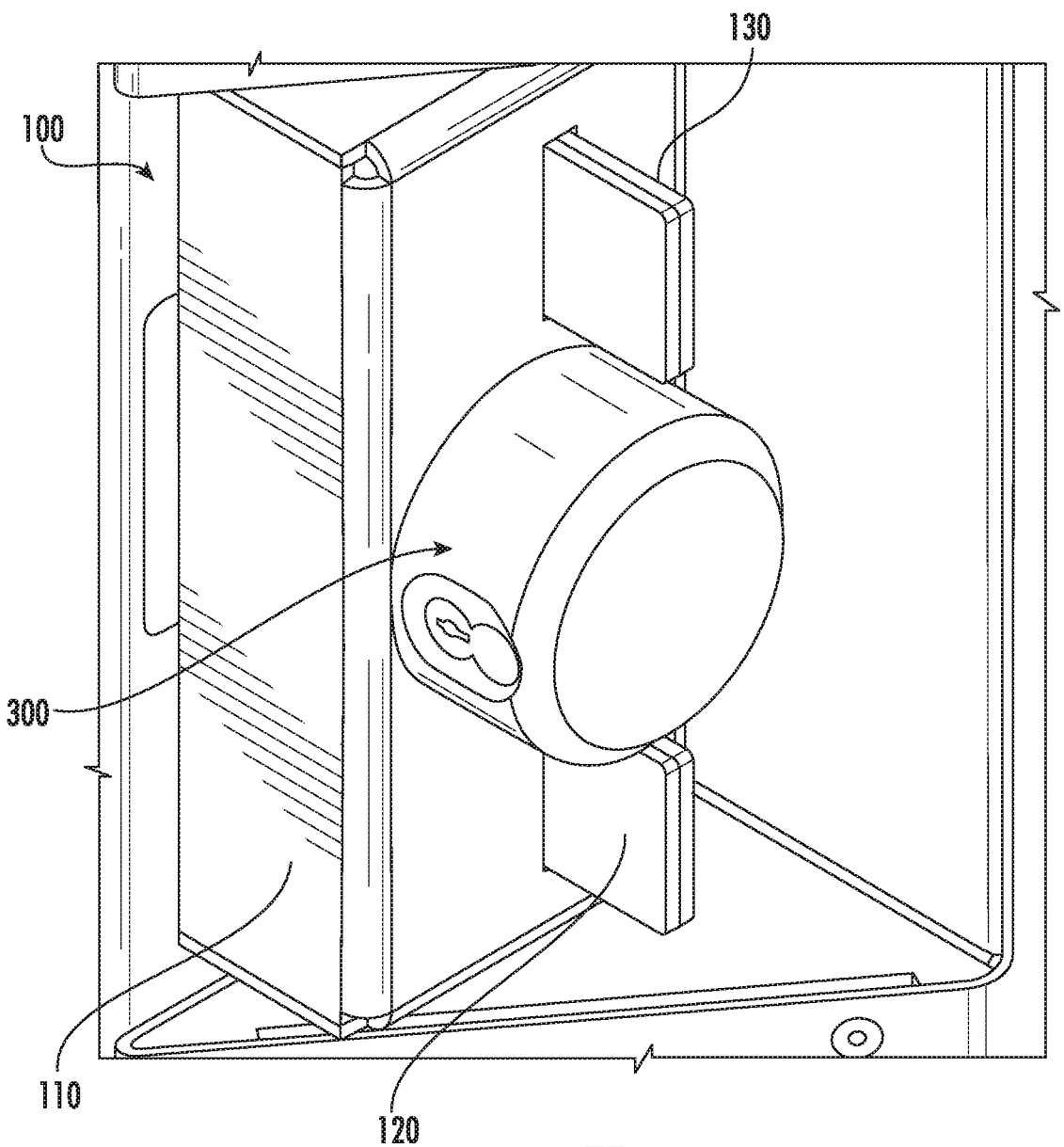

Installation of the theft deterrent system 100 onto a cabinet 200 may proceed as partially shown in FIGS. 7A-7E. First, as shown in FIG. 7A, the first hasp 120 may be installed. A central stud 126 of the plurality of studs 126 may be fed into a through-hole of a padlock ring 216 of a handle 212 of the cabinet 200. Next, as shown in FIG. 7B, the second hasp 130 may be installed by feeding the plurality of studs 126, which are installed into the first hasp 120, into respective receiving holes 136 of the second hasp 130. Although in some embodiments, nuts or other couplers may be provided to secure the first hasp 120 and the second hasp 130 together (via the plurality of studs 126), in some embodiments the second hasp 130 may not be coupled to the plurality of studs 126 and instead merely hang on the plurality of studs 126 and held in place during installation. Another view of the process of installing the theft deterrent system 100 at this point (e.g., after completion of the operation of FIG. 7B) is shown in FIG. 7C, which also shows the pocket 214 of the cabinet 200 onto which the theft deterrent system 100 is being installed. Installation continues as shown in FIG. 7D. The shield retainer 110 may be slid onto the tabs 122, 124, 132, 134 of the first hasp 120 and second hasp 130, thereby covering or surrounding at least a portion of the first hasp 120 and the second hasp 130. The first panels 121, 131 and the second panels 123, 133 of the hasps 120, 130 may be also covered by the shield retainer 110. The outer tabs 122/132 and central tabs 124/134 may be left uncovered or not surrounded by the shield retainer 110. As shown in FIG. 7E, a hidden shackle lock 300 may be used to secure the electronics cabinet 200. The hidden shackle lock 300 may be unlocked, allowing a shackle 304 of the hidden shackle lock 300 to travel beyond a circumference of the hidden shackle lock 300. The opening 308 of the hidden shackle lock 300 may be positioned such that central tabs 124/134 of the first hasp 120 and the second hasp 130 enter the opening 308. The shackle 304 is then locked by having the shackle 304 travel through the opening 308 and through the through-holes 125, 135 of the first hasp 120 and the second hasp 130. The hidden shackle lock 300 is then locked using its locking mechanism. Removal of the theft deterrent system 100 may proceed in a reversal of the above operations.

As seen from review of FIGS. 7D and 7E, the hidden shackle lock 300 secures the first hasp 120 to the second hasp 130, by securing the central tabs 124/134 of the hasps. Motion of the first hasp 120 relative to the second hasp 130 (e.g., motion perpendicular to the second panels of the hasps and parallel to the shackle 304) may be thereby largely prevented. Moreover, motion perpendicular to the shackle 304 may be also largely prevented by the shield retainer 110. Further, prying of the hidden shackle lock 300 or the like may be largely prevented by the outer tabs 122/132, which may extend beyond a front panel of the shield retainer 110.

In some embodiments, the first hasp 120 and the second hasp 130 may be formed together as a single unitary component and machined or manipulated to form the channel into which the handle 212 of the electronics cabinet 200 may be received. In such embodiments, the plurality of studs 126 may be not permanently secured to a portion of the unitary component corresponding to the first hasp 120, and instead at least one stud, rod, screw, or other similar coupling component may be fed through a receiving hole on a first side of the unitary component, through the padlock ring of the handle, and into a receiving hole on a second side of the unitary component. The coupling component may then be secured via a hex nut, cotter pin, or the like to prevent longitudinal sliding.

Although the theft deterrent system 100 of FIGS. 3A-6B may provide a degree of security previously unrecognized, the inventors have also realized that increased security beyond that of the theft deterrent system 100 may be desirable. In contrast to the theft deterrent system 100 shown in FIGS. 3A-6B, a theft deterrent system 150, shown in FIGS. 8A-11, completely surrounds the first hasp 120 and the second hasp 130, as well as largely surrounds the outer circumference of the hidden shackle lock 300.

Figure 8A:
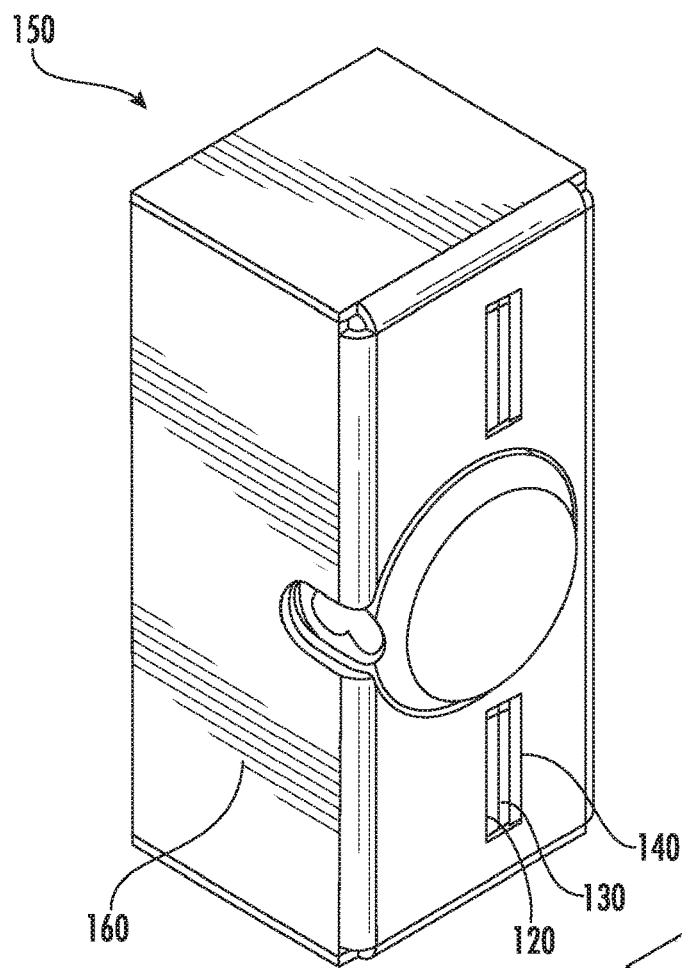
FIG. 8A is a front perspective view of a theft deterrent system in accordance with the inventive concepts of the present disclosure.
Figure 8B:
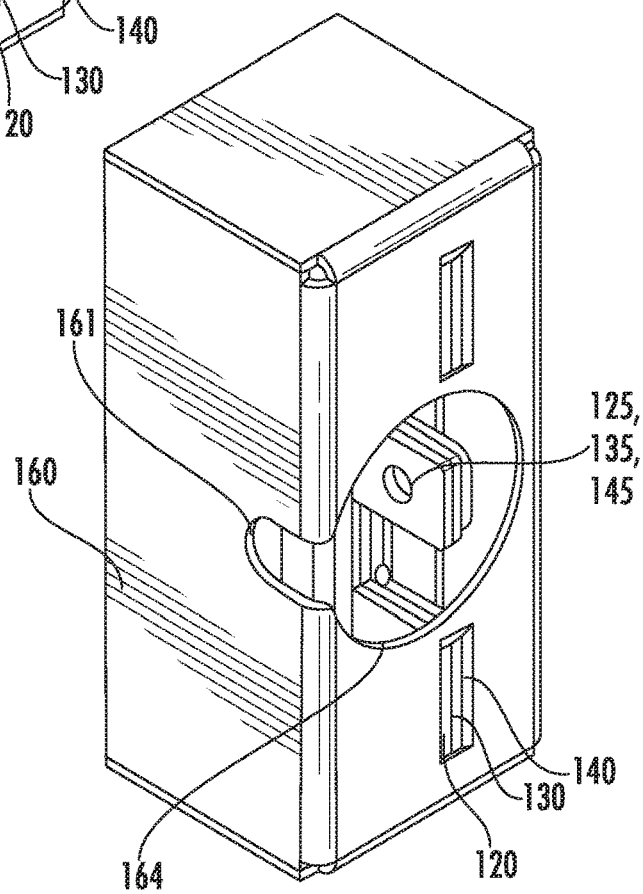
FIG. 8B is a front perspective view of the theft deterrent system of FIG. 8B, with the hidden shackle lock removed.
Figure 11:
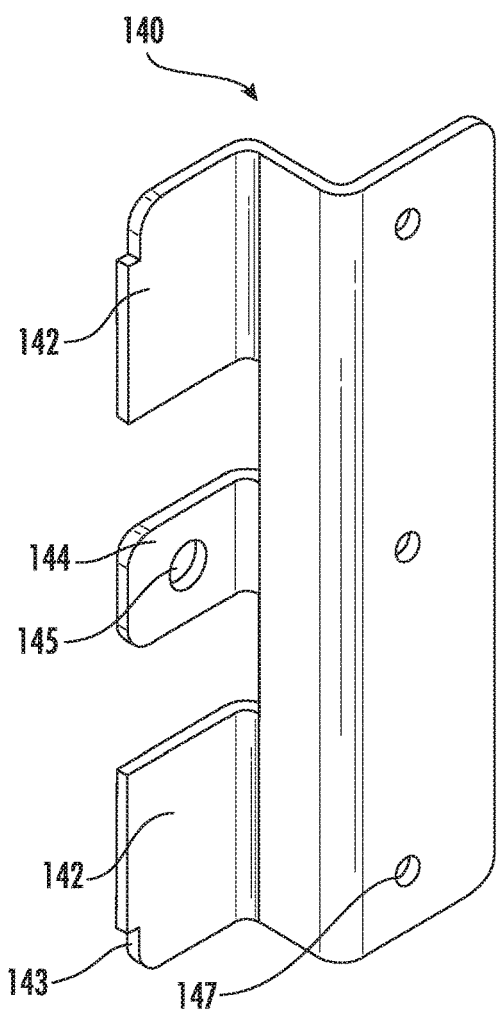
FIG. 11 is a view of the adapter of FIG. 9A.

As shown in FIGS. 8A and 8B, the first hasp 120 and the second hasp 130 are similar to those already discussed herein with reference to FIGS. 4A, 4B, and 5, and discussion of the same is omitted in the interest of brevity. The theft deterrent system 150 further comprises a shield retainer 160 and an adapter 140, which together form a subassembly shown in FIGS. 9A and 9B, with the shield retainer 160 shown individually in FIG. 10, and the adapter 140 shown individually in FIG. 11. The adapter 140 may include outer tabs 142 and a central tab 144, similar to the outer tabs and central tabs of the first hasp 120 and the second hasp 130. As best seen in FIG. 11, the outer tabs 142 may include a cutout 143. Once installed, an inner surface of the cutout 143 may sit flush with an inner surface of a slot 162 in the shield retainer 160, which may increase the rigidity of one or both components. The adapter 140 may also include a plurality of holes 147 in a panel thereof, which are configured to receive corresponding studs 168 that extend from a panel of the shield retainer 160. These studs 168 may be self-clinching in some embodiments.

Figure 9A:
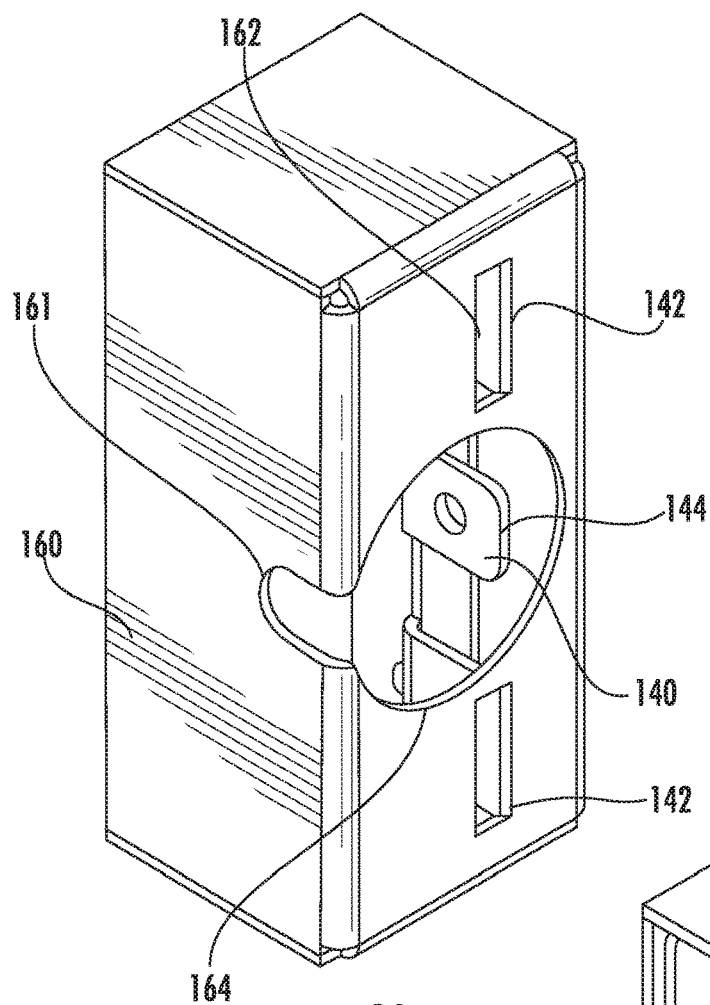
FIG. 9A is a front perspective view of a shield retainer and adapter hasp subassembly of the theft deterrent system of FIG. 8A.
Figure 9B:
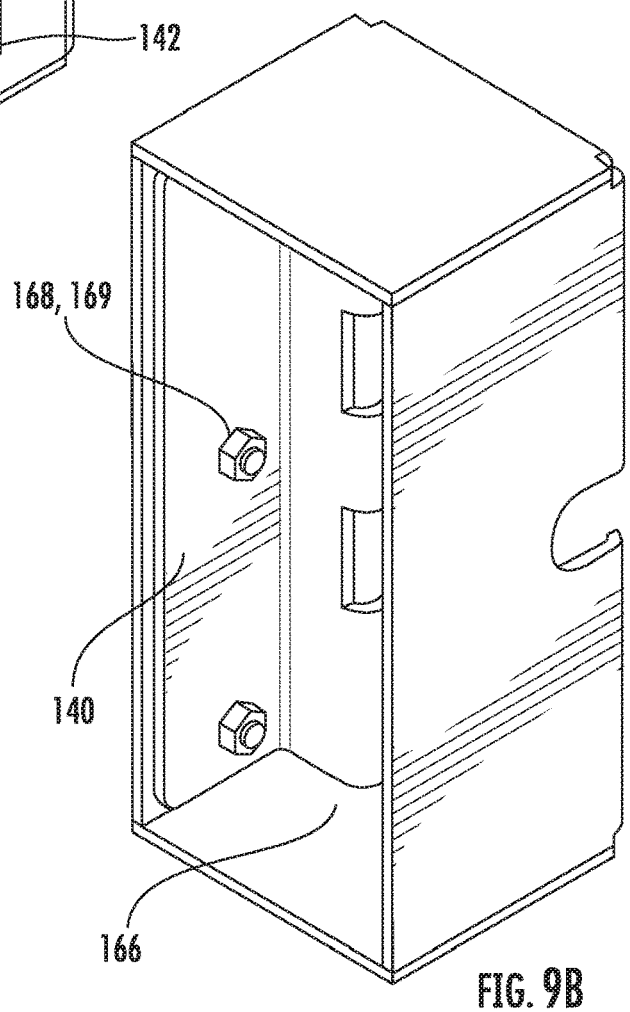
FIG. 9B is a rear perspective view of the shield retainer and adapter hasp subassembly of FIG. 9A.
Figure 10:
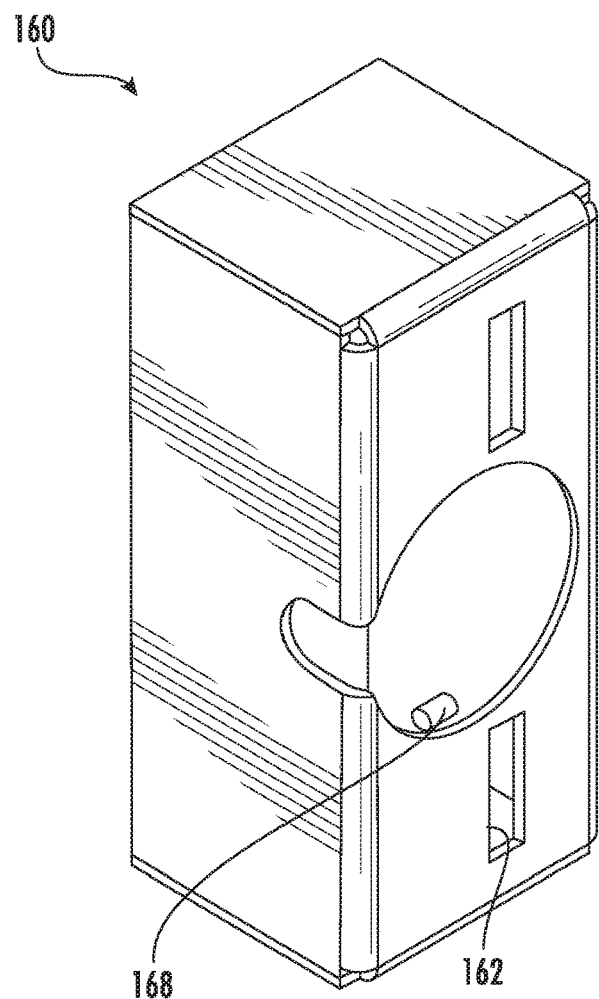
FIG. 10 is a front perspective view of the shield retainer of FIG. 9A.

As best seen in FIG. 9B, prior to installation of the theft deterrent system 150 onto an electronics cabinet 200, the adapter 140 may be inserted into an opening 166 in the rear or back surface of the shield retainer 160, and may be seated onto the plurality of studs 168 via the holes 167 in a panel thereof. The adapter 140 may be secured to the shield retainer via hex nuts 169 or other fastening components. Bends, curves, and/or other features may be provided in the body of the adapter 140 such that, when installed, the central tab 144 of the adapter 140 sits flush with, or is otherwise proximate to, the tabs 124/134 of the first hasp 120 and the second hasp 130. The central tab 144 has a through-hole 145 therein, which is dimensioned to receive a shackle 304 of a hidden shackle lock 300.

As best seen in FIG. 8B, the shield retainer 160 may include a shackle travel slot 161, and an opening 164. The shackle travel slot 161 may be substantially "U" shaped, and may allow a hidden shackle lock 300 inserted into the opening 164 to be locked and unlocked, by allowing the shackle 304 of the hidden shackle lock 300 to travel beyond the outer circumference of the hidden shackle lock 300 (and beyond an outer wall of the shield retainer 160).

Figure 12A:
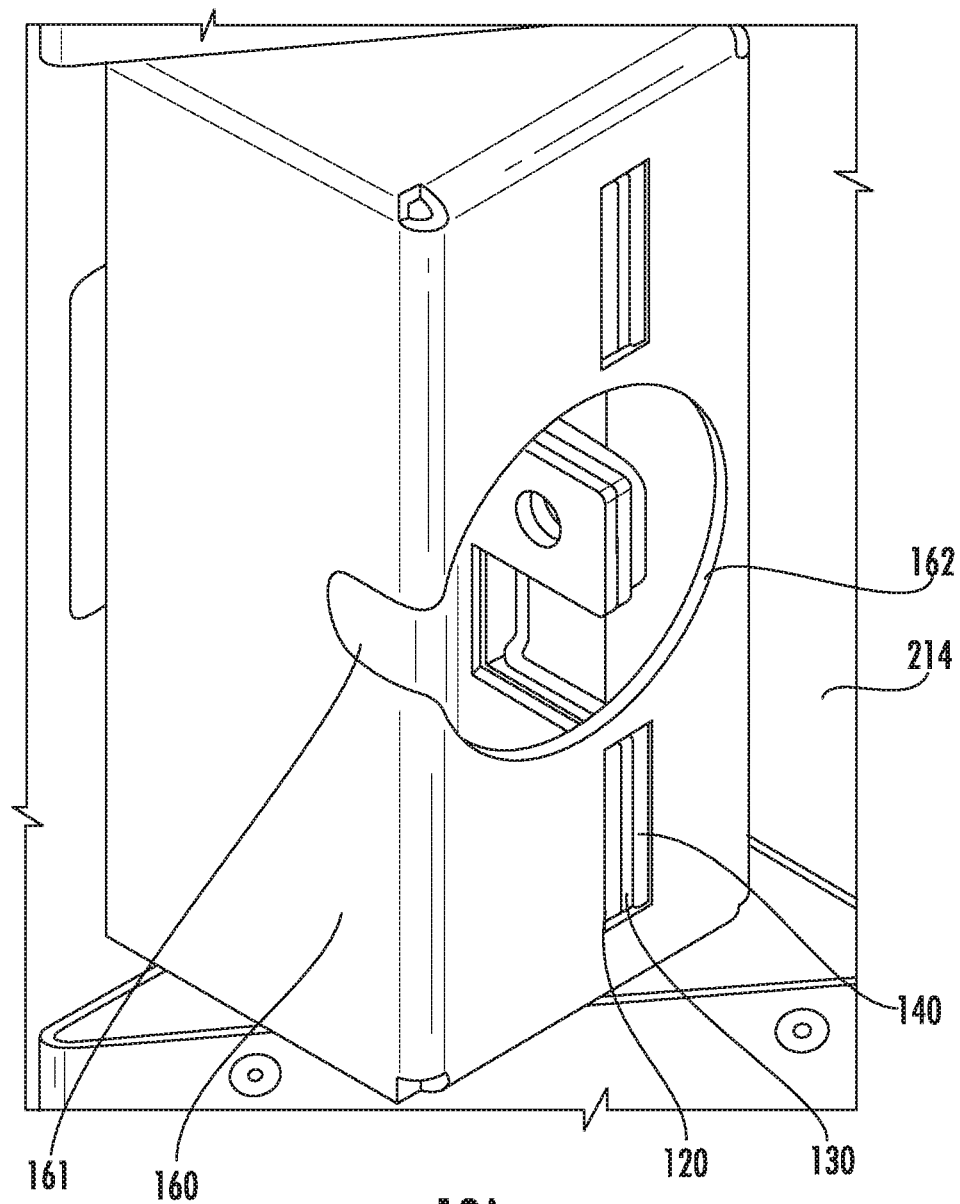
FIGS. 12A and 12B are views of operations of installing the theft deterrent system of FIG. 8A on an electronics cabinet.
Figure 12B:
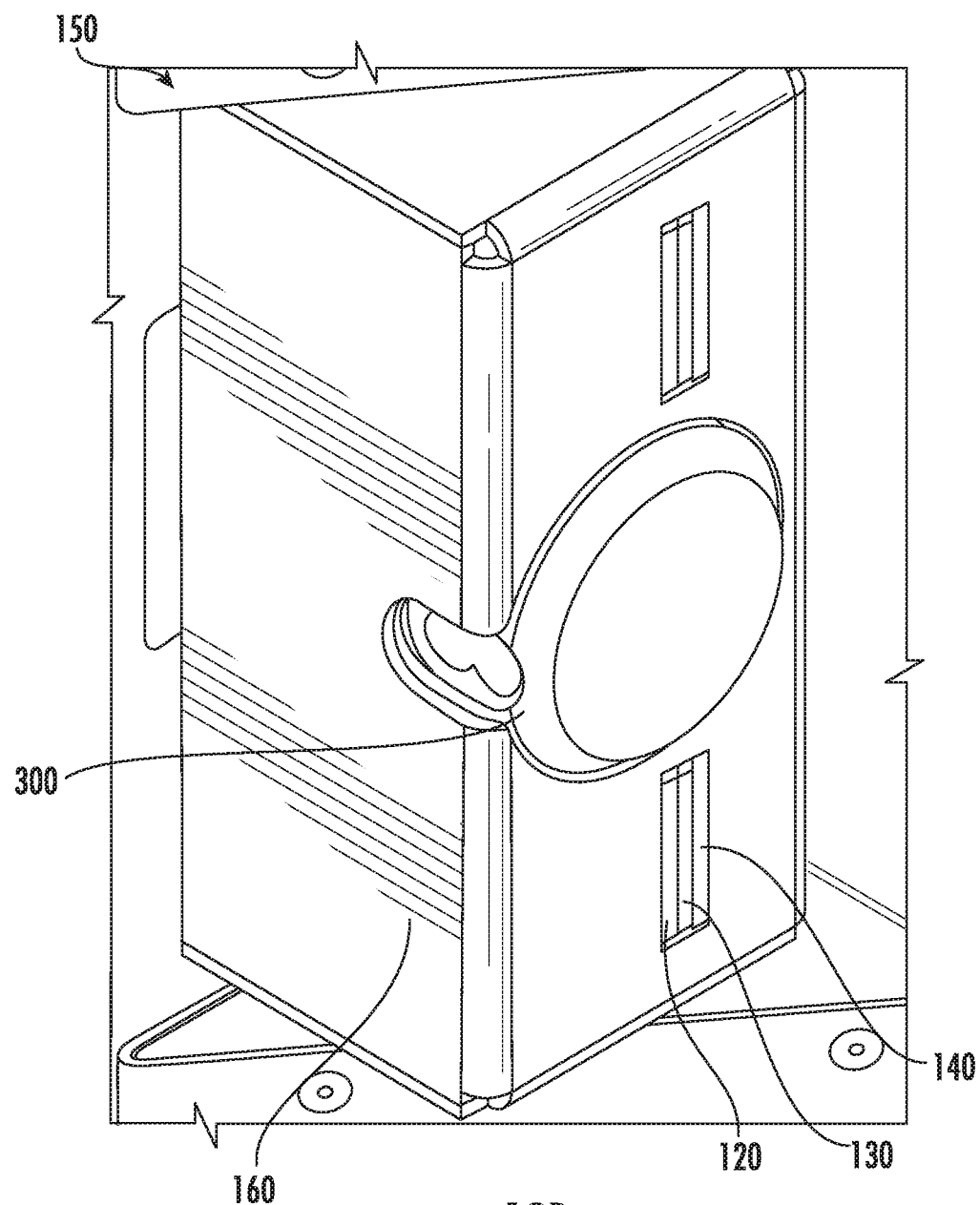

Installation of the theft deterrent system 150 may proceed as follows. First, operations corresponding to FIGS. 7A-7C may be performed. Next, as shown in FIG. 12A, the shield retainer 160 (with adapter 140 installed) may be positioned to cover the first hasp 120 and the second hasp 130. The shield retainer 160 may be dimensioned to be larger than the shield retainer 110, such that the tabs 122, 124, 132, and 134 of the first hasp 120 and the second hasp 130 do not extend beyond a front panel of the shield retainer 160. In some embodiments, front surfaces of the tabs 122, 124, 132, and 134 may be substantially flush with the front surface of the shield retainer 160. Next, as shown in FIG. 12B, an opening 308 of an unlocked hidden shackle lock 300 is positioned such that tab 124, tab 134, and tab 144 are inserted into the opening 308 while the hidden shackle lock 300 is seated into the opening 164 of the shield retainer 160. The lock 300 is then locked by having the shackle 304 travel into the hidden shackle lock 300 and having the locking mechanism of the lock 300 engage. Removal of the theft deterrent system 150 may proceed in a reversal of the above operations.

The theft deterrent system 150 may provide greater security of the electronics cabinet 200, because access to the hidden shackle lock 300 is largely prevented. For example, it may be difficult or impossible to apply rotational forces to the hidden shackle lock 300 (e.g., via a pipe wrench) because the hidden shackle lock 300 is seated within the opening 164 of the shield retainer. Prying or other forcible actions may also be prevented by the arrangement of the shield retainer 160, the first and second hasps 120 and 130, and the adapter 140. The first and second hasps 120 and 130, as well as the shield retainer 160 (via the adapter 140) are all secured together via the shackle 304 of the hidden shackle lock 300.

In some embodiments, either the theft deterrent system 100 or the theft deterrent system 150 may be arranged on a door that lacks a pocket 214.

In accordance with the above, parts of the theft deterrent system 100 and parts of the theft deterrent system 150 provided herein may be mounted and secured to the cabinet 200 using only a lock (e.g., the hidden shackle lock 300) and other mounting components or extra hardware may be omitted. Further, it is envisioned that no or little drilling or cutting of either the cabinet or of the components of the theft deterrent system 100 or of the theft deterrent system 150 may be required to install the theft deterrent system 100 or the theft deterrent system 150. The dimensions of the hidden shackle lock 300 and the shackle 304 thereof are incorporated into the design of the theft deterrent system 100 and of the theft deterrent system 150. Accordingly, field installed cabinets may be updated with the theft deterrent system 100 or the theft deterrent system 150 more easily, with minimal retrofitting required.

In accordance with the present disclosure, the theft deterrent systems 100 and 150 may prevent access to an existing handle 212 and/or padlock ring thereof of a cabinet 200 and may be used to increase security. Furthermore, using the theft deterrent systems 100 and 150 may further protect access to the handle 212 and provide additional protection to a hidden shackle lock 300 to prevent damage or removal of the hidden shackle lock 300 or the handle 212 using saws or cutting tools. It is envisioned that in some embodiments the installation process may performed without any tools other than the lock itself and without any modification to an existing cabinet.

In addition to the different embodiments shown above, those of skill in this art will appreciate that other configurations may also be suitable for use. The inventive concepts being thus described, it will be apparent that the same may be varied in many ways. Such variations are not to be regarded as a departure from the spirit and scope of the inventive concepts, and all such modifications as would be obvious to one skilled in the art are to be included within the scope of the following claims.

That which is claimed is:

1. A method comprising:
feeding a stud extending from a first hasp into a through-hole in a padlock ring of a handle of an electronics cabinet, wherein the first hasp is adapted to at least partially cover the handle, and wherein the first hasp comprises a first tab having a shackle hole therein;
feeding the stud extending from the first hasp into a receiving hole in a second hasp, wherein the second hasp is adapted to at least partially cover the handle, and wherein the second hasp comprises a second tab having a shackle hole therein;
aligning a shield retainer to surround at least a portion of the first hasp and at least a portion of the second hasp;
inserting a shackle of a lock through the first tab shackle hole and through the second tab shackle hole; and
locking the lock.

2. The method of claim 1, wherein the shield retainer comprises a slot dimensioned to receive the first tab of the first hasp and the second tab of the second hasp therein, and wherein aligning the shield retainer to surround at least a portion of the first hasp and at least a portion of the second hasp comprises extending the first tab of the first hasp and the second tab of the second hasp through the slot.

3. The method of claim 2, further comprising a hidden shackle lock having a shackle, wherein the shackle is received through the first tab shackle hole of the first hasp and the second tab shackle hole of the second hasp.

4. The method of claim 1, wherein the shield retainer comprises an adapter that includes a tab having a shackle hole therein.

5. The method of claim 1, wherein the first hasp has a first surface, and wherein the first hasp further comprises a second surface that extends perpendicular to the first surface.

6. The method of claim 5, wherein the second hasp has a third surface, and wherein the second hasp further comprises a fourth surface that extends perpendicular to the third surface.

7. The method of claim 1, wherein the first hasp and the second hasp comprise galvanized steel.

8. The method of claim 1, wherein the first hasp and second hasp are separate bodies.

* * * * *